DECODER

Filed Oct. 2, 1967 3 Sheets-Sheet 1

Inventors
ALEC H. REEVES
JOSEPH H. McNEILLY
By Alfred C. Hill
Agent

Inventors
ALEC H. REEVES
JOSEPH H. McNEILLY
By Alfred C. Hill
Agent

Inventors
ALEC H. REEVES
JOSEPH H. McNEILLY
By Alfred C. Hill
Agent

United States Patent Office 3,526,889

Patented Sept. 1, 1970

3,526,889
DECODER

Alec Harley Reeves and Joseph Hood McNeilly, Harlow, England, assignors to International Standard Electric Corporation, New York, N.Y., a corporation of Delaware Filed Oct. 2, 1967, Ser. No. 672,243
Claims priority, application Great Britain, Oct. 31, 1966, 48,615/66
Int. Cl. H03k 13/02
U.S. Cl. 340—347 10 Claims

ABSTRACT OF THE DISCLOSURE

A compressed pulse code modulation signal presets a binary counter and shock excites a damped tuned circuit to produce a damped wave of fixed initial amplitude and fixed rate of decay. This wave is applied to a threshold detector which advances the counter each time the wave exceeds the threshold. A maximum count detector indicates when the counter is full whereupon the next succeeding half cycle of the wave is applied to a peak storage circuit. The storage circuit is sampled to give an expanded pulse amplitude modulated version of the pulse code modulation signal.

BACKGROUND OF THE INVENTION

This invention relates to signal converters and more particularly to a decoder for a signal in pulse code modulation (PCM) form.

SUMMARY OF THE INVENTION

An object of the present invention is to provide an expanding decoder for a pulse code modulation word to cooperate with the compressing encoder of the copending application of J. H. McNeilly, Ser. No. 574,414, filed August 23, 1966 to provide a companding pulse code modulation system.

A feature of this invention is the provision of a decoder for a pulse code modulation word comprising a source of the word; counter means coupled to the source responsive to the word to preset the counter means to a numerical value representing the value of the word; generator means coupled to the source responsive to the word to produce simultaneously with the presetting of the counter means a damped wave train output having a fixed initial amplitude and a fixed rate of decay; threshold detection means coupled to the generator means and the counter means producing an advance signal for the counter means when the damped wave train exceeds a given threshold value; first means coupled to the counter means to produce a control signal when the counter means is full; and second means coupled to the generator means and the first means to produce when the control signal is produced a pulse amplitude modulation (PAM) output version of the word.

The decoding arrangement must correspond to the code employed. In a speech transmission system, the decoder is chosen to correspond to an encoder. However, in data processing applications, where for example, in a multiplier for two or more quantities, exponentially weighted code words are added and their sum expanded, the summer is a data processing device and not a PCM coder.

In a preferred embodiment of the invention, the PCM signal is obtained from a coder and is compressed according to a regular compression law, the decoder being such that the output of the second means including peak storage circuit is a reconstructed PAM version of the original signal (e.g. analog speech) before encoding and compression.

The invention resides in the method described and in circuitry for carrying out the method, and also in telecommunication systems embodying a decoder of the type described.

BRIEF DESCRIPTION OF THE DRAWING

The above mentioned and other features and objects of this invention will become more apparent by reference to the following description taken in conjunction with the accompanying drawings, in which.

DESCRIPTION OF THE PREFERRED EMBODIMENT

Figures 1, 2:
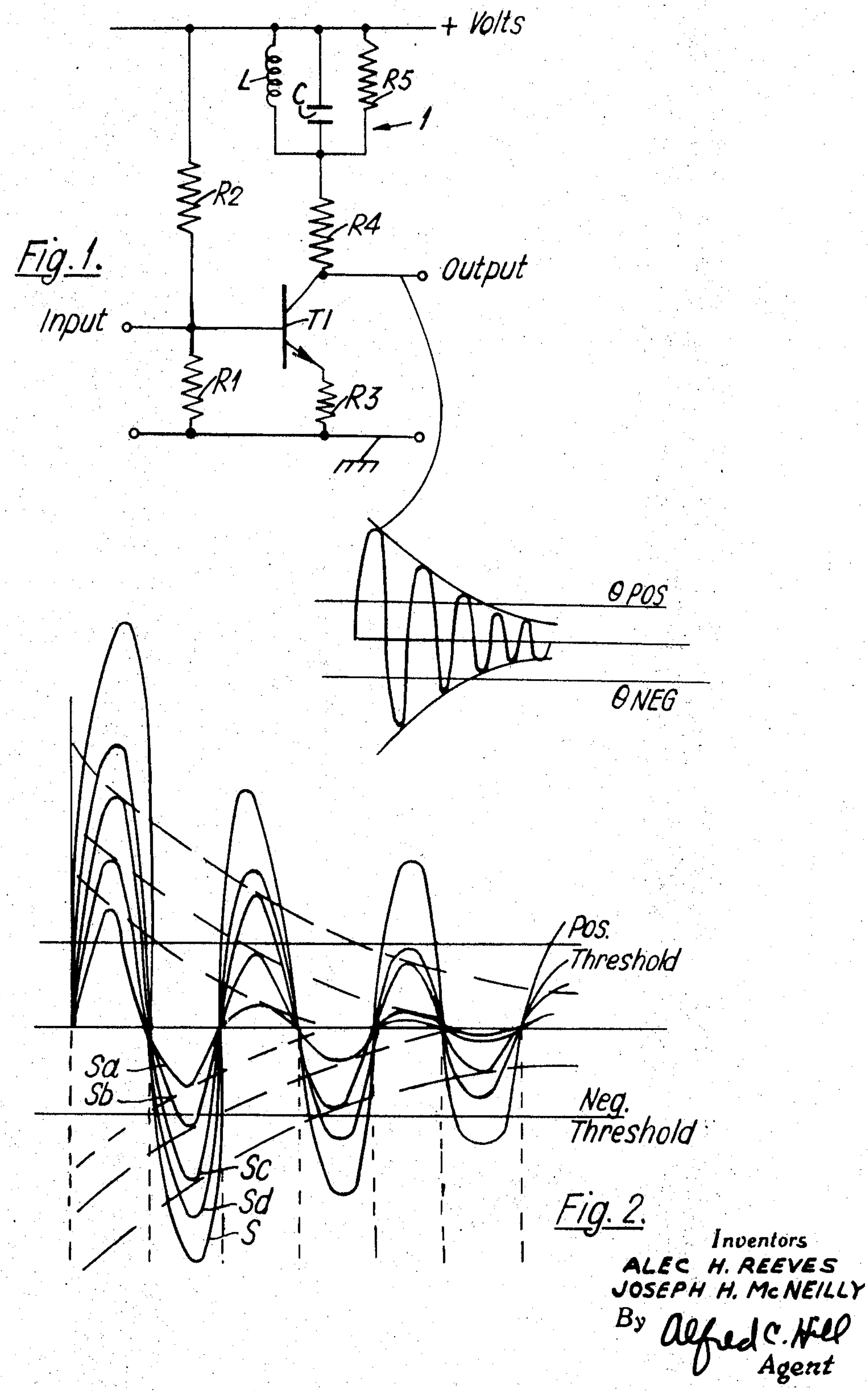
FIG. 1 is a tuned circuit with positive damping employed in the above cited copending application which is excited by the application of an input PAM pulse.
FIG. 2 illustrates the several responses of the circuit of FIG. 1 to excitation by signals of different amplitudes of such a circuit.
Figure 3:
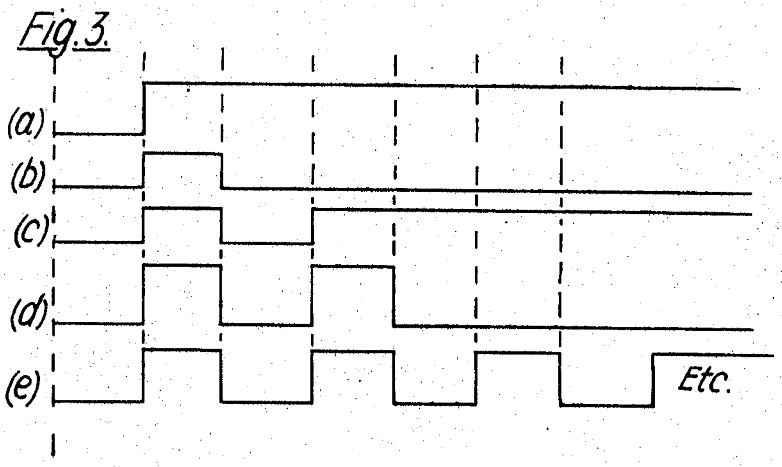
FIG. 3 shows the outputs of FIG. 2 converted to digital form by a modulator which includes a threshold detector.

The following description, insofar as it relates to FIGS. 1, 2 and 3, is of a coder for conversion of a signal into PCM form as disclosed in the above cited copending application.

Consider first the operation of the circuit of FIG. 1 including transistor T1, resistors R1, R2, R3 and R4 and tuned circuit 1 having inductance L, capacitor C and resistor R5. Tuned circuit 1 is shock excited by a PAM sample applied at the input and gives at the output a response of the form $$V \exp(-kt) \sin wt$$

where exp denotes the exponential function, $k$ is a positive constant called the damping factor, $w$ is the resonant frequency of the circuit, $t$ is time measured from $t=0$ initially and V is the amplitude of the PAM sample. This wave train is then applied to a threshold detector (for example, a bistable with thresholds $\theta_{POS}$ and $\theta_{NEG}$, respectively). The detector gives an output each time the damped sine wave rises above $\theta_{POS}$, or falls below $\theta_{NEG}$. A binary counter counts the number of pulses from the detector and the counter reading is converted to PCM by a serializer.

FIG. 2 illustrates the response $S_a$, $S_b$, $S_c$, $S_d$ and S to sample pulses applied to a tuned circuit having positive damping.

FIG. 3 illustrates the differing response according to amplitude of a bistable device to which each of the wave trains of FIG. 2 is applied. Curves (*a*), (*b*), (*c*), (*d*) and (*e*) are the responses, respectively, due to wave trains $S_a$, $S_b$, $S_c$, $S_d$ and S of FIG. 2.

In curve (*a*) the bistable switches ON due to the first positive and stays on.

In curve (*b*) the bistable comes ON due to the first positive and OFF due to the first negative and stays off.

In curve (*c*) the bistable comes ON and OFF due to the first cycle, comes ON due to the second positive and stays ON.

In curve (*d*) the bistable continues triggering one count longer, since the initial sample amplitude is greater.

In curve (*e*) the bistable continues to trigger for some time.

The voltage applied to the bistable is of the form $r \exp(-kt) \sin wt$ where exp denotes the exponential function $k$ is the damping factor of the tuned circuit, $w$ is the resonant frequency of the tuned circuit,
$t$ is time measured positively from the instant $t=0$ when the modulator circuit (whose response is nearly instantaneous) is excited, and
$r$ is the amplitude of the envelope of the damped wave train at time $t=0$, whose value depends on the value of the PAM sample.

If $r_1$ corresponds to wave train $S_d$, $r_2$ to $S_c$, $r_3$ to $S_b$, and $r_4$ to $S_a$, and if the ON threshold of the bistable is set at a potential of $+v$ and the OFF threshold at a potential of $-v$, then Curve (a) occurs when $$v=r_1 \exp\left(\frac{-kT}{4}\right)$$

Curve (b) occurs when $$-v=r_2 \exp\left(\frac{-3kT}{4}\right)$$

Curve (c) occurs when $$x=r_3 \exp\left(\frac{-5kT}{4}\right)$$

Curve (d) occurs when $$-v=r_4 \exp\left(\frac{-7kT}{4}\right)$$

where T is the period of oscillation of the tuned circuit. Hence, $$r_2=r_1e\frac{kT}{2},\ r_3=r_2e\frac{kT}{2}\cdot\ r_4=r_3e\frac{kT}{2}$$

It is clear from this that in order to go from one condition of the bistable to the next, the applied signal must be increased by a factor of $$e\frac{kT}{2}$$

giving a smooth companding law.

The output from the bistable gives a companded quantised version of the PAM sample in digital form. To convert this to PCM we need only to count the edges in the output from the bistable with a binary counter and then to serialize.

If the counter has $m$ bits, then it can count $2^m-1$ input pulses. Suppose the maximum initial amplitude which is normally encountered equals M, then the following list shows the number of inputs registered by the binary counter of the encoder against the modulus of the amplitude of the half cycle giving that count, the initial amplitude (of the envelope) having the value M.

With two thresholds $\theta_{POS}$ and $\theta_{NEG}$, then at count 1, the amplitude is $$M \exp\left(\frac{-kT}{4}\right)$$

at count 2, the amplitude is $$M \exp\left(\frac{-3kT}{4}\right)$$

at count 3, the amplitude is $$M \exp\left(\frac{-5kT}{4}\right)$$

* * * * * at count $r$, the amplitude is $$M \exp -(2r-1)\frac{kT}{4}$$

* * * * * at count $2^m-1$, the amplitude is $$M \exp -(2^{m+1}-3)\frac{kT}{4}$$

The final count $2-1$ occurs when the amplitude of the corresponding half cycle is just equal to the threshold level $\theta$, i.e. the condition to be satisfied if the counter is to handle exactly the full range of coder input is $$\theta=M \exp -(2^{m+1}-3)\frac{kT}{4} \quad (1)$$

Consider a particular value of applied sample R which is just sufficient to give a count $r$, then $$\theta=R \exp -(2r-1)\frac{kT}{4} \quad (2)$$

The code group corresponding to a count of $r$ is then sent down the line as a PCM signal. (In an alternative form of threshold detector there is only one threshold, $\theta$ say, which is positive. By a correct choice of the values of $k$ and $\theta$ the capacity of the counter can be arranged to correspond to the full range of the input signal.)

Figure 4:
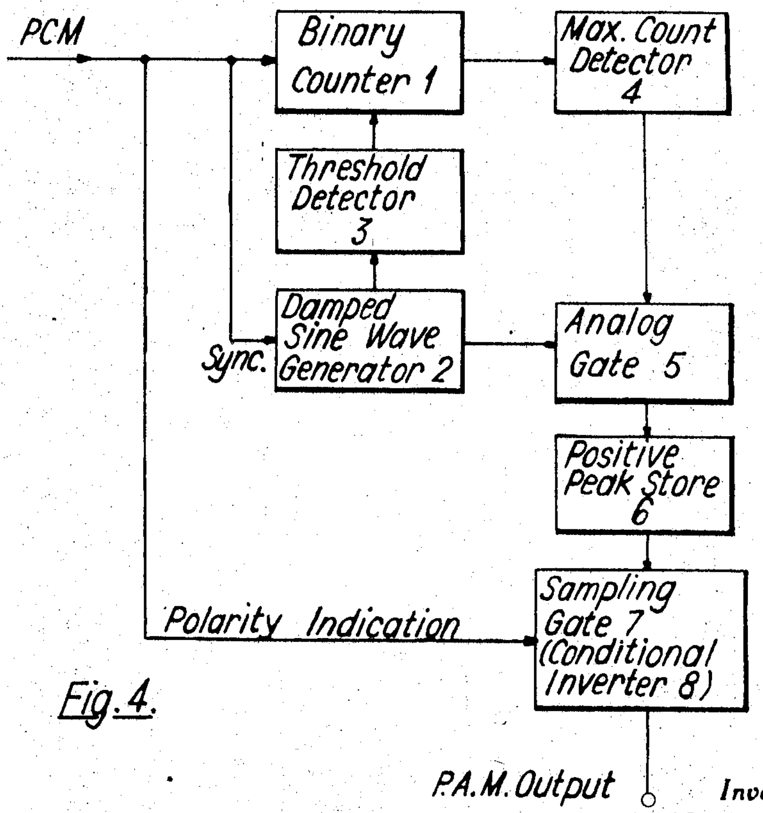
FIG. 4 is a block diagram of the decoder in accordance with the principles of the present invention.

At the decoder of FIG. 4, the incoming code from the line presets the condition of binary counter 1 and at the same time (i.e. synchronously) initiates at damped sine wave generator 2 a damped sine wave whose initial amplitude is fixed at, say, A. The sine wave output is applied to threshold detector 3 which gives an output when the amplitude of the wave train is in excess of the threshold value. The outputs of detector 3 are added in counter 1, building up the count from its preset value $r$. When the counter reaches its maximum and all the digits are ones, the next input from the detector can be arranged to cause all digits to switch back to 0. This transition is recognized by maximum count detector 4 which causes the modulus of the next half cycle from damped sine wave generator 2 to be read out via analog gate 5.

Assume the damping of the tuned circuits of the coder and the decoder to be the same, and the resonant frequencies to be the same and the respective threshold levels to be equal. If the input R gives a count $r$, the incoming code from the line to the decoder will represent $r$ counts and, therefore, an additional $(2^m-1)-r$ pulses are required to bring the counter to all 1's. The next pulse takes the counter from all 1's to all 0's, and the modulus of the following half cycle gives the output via analog gate 5, i.e. the amplitude corresponding to the count $(2^m-r)$. This amplitude is given by $$S=A \exp -\frac{kT}{4}[2(2^m-r)-1]$$

i.e.

$$S=A \exp -\frac{kT}{4}(2^{m+1}-2r-1) \quad (3)$$

From Equations 1 and 2

$$M \exp -(2^{m+1}-3)\frac{kT}{4}=R \exp -(2r-1)\frac{kT}{4}$$

Hence, $$\frac{R}{M}=\exp -\frac{kT}{4}(2^{m+1}-2r-2) \quad (4)$$

From Equations 3 and 4

$$S=\frac{A}{M}R \exp -\frac{kT}{4}$$

For the modulus S of the next half cycle of the decoder sine wave following the counter transition from full to all zeros to give an expanded decoded output which, to the nearest level, is equal to the original input to the coder, i.e. for R to be identically equal to S (or for the input to the encoder to be equal to the output of the decoder) we require $$M=A \exp -\frac{kT}{4} \quad (5)$$

In other words the initial amplitude of the envelope of the tuned circuit response must be higher than the maximum input to the encoder by a factor of $$\exp \frac{kT}{4}$$

Maximum count detector 4 gives an indication when counter 1 is filled and gate 5 is opened (i.e. by being short circuited). The damped sine wave is thus allowed to reach a peak voltmeter or store circuit 6 which registers and stores the amplitude of the first positive half cycle which gets through the gate. The width of the sampling pulse is not important, since all succeeding positive half cycles will be less than the first. The PAM output is obtained by using sampling gate 7 to sample the voltage in peak store 6. However, since the PCM input can represent either a positive or negative sample it is necessary to reverse the output from the peak store when the signal from the line indicates a negative sample and so a polarity indication is fed from the PCM input to conditional inverter 8.

In the case where the damped sine wave is applied to two thresholds at $\pm\theta$ we will require two peak storage circuits; one for positive and one for negative signals. The width of the gating pulse from the maximum count detector should be such that only one half cycle is allowed through the gate. The amplitude of this half cycle is held in one of the peak storage circuits while the other one remains at zero and the output is obtained by sampling the sum of the voltages on the two peak stores. This output may have to be inverted depending on the polarity indication from the line.

It may be necessary to allow more time between detecting maximum count in the decoder counter and registering the amplitude of the next half swing. We can afford to wait an extra half period before reading the output and still get the correct answer providing the initial amplitude is increased by a further factor $$\exp \frac{kT}{2}$$

i.e., by making the initial amplitude of the decoder envelope equal to B, where $$B = M \exp \frac{3kT}{4}$$

If only one threshold, $+\theta$, say, is used, then to obtain the same number of counts in a given time the frequency of the damped sine wave requires to be double the frequency used in the two-threshold arrangement, but the problem of having the decoded output either positive or negative depending on whether it is a positive or negative half cycle which gives the final count is avoided.

The compression law of the encoder is matched with the expansion law of the decoder in a straightforward way by having the resonant frequencies of the encoder and decoder sine wave generators equal and the respective decay constants also equal.

Figure 5:
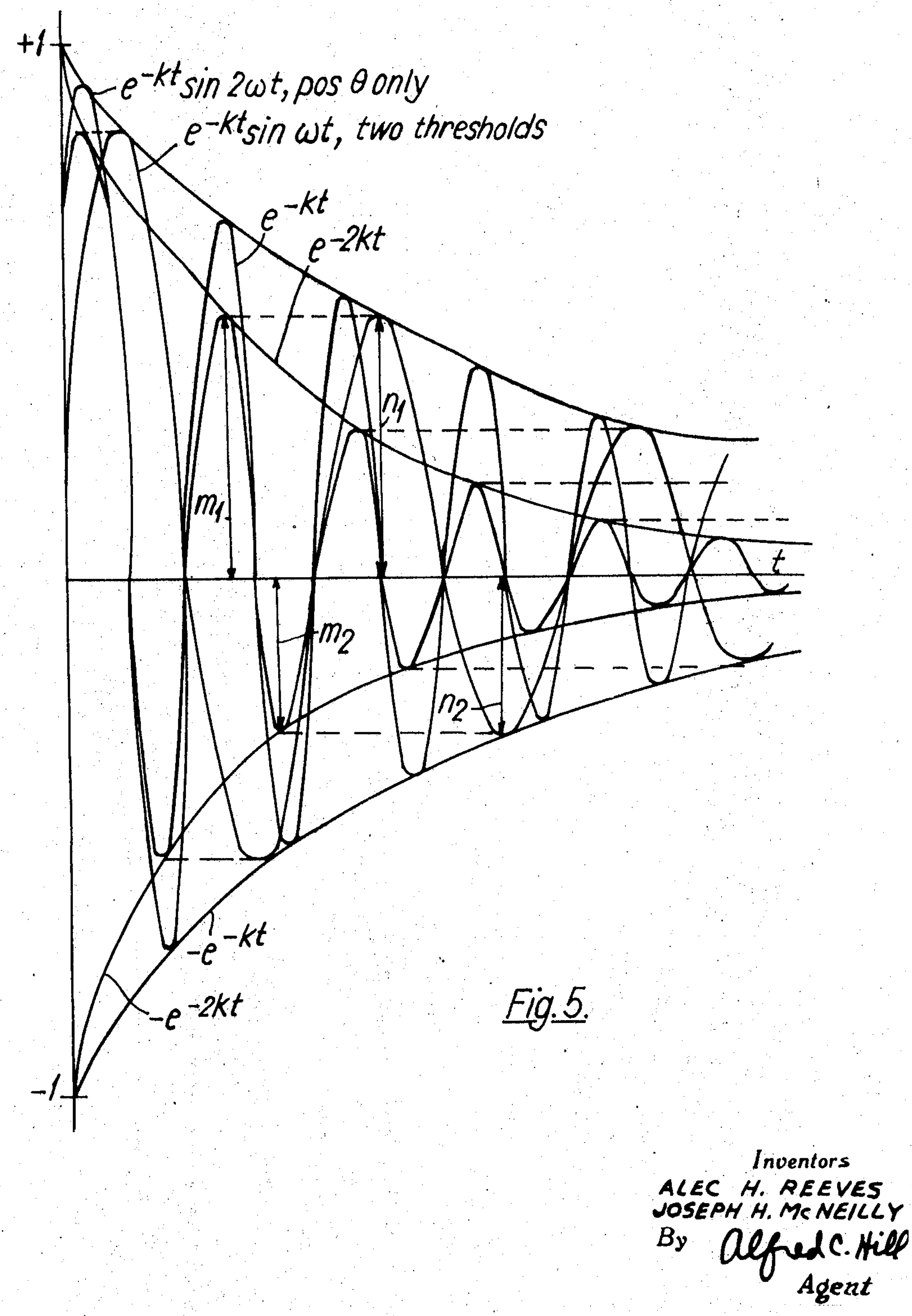
FIG. 5 illustrates a number of decaying sine waves with their respective envelopes.

Other possibilities are illustrated in FIG. 5 which shows a number of waveforms with their associated envelopes. The waveform $\exp(-kt) \sin wt$ has envelope $\pm\exp(-kt)$. The waveform with symmetrically placed positive and negative thresholds gives the same code as does $\exp(-kt) \sin 2wt$ with only a positive threshold, equivalence of codes being determined by the ratio of relevant pairs of successive peaks (thus if two thresholds are provided, the ratio is (modulus of first positive going half cycle) (modulus of negative going half cycle which follows), while in the single threshold situation the ratio is of successive positive half cycles).

The waveform $\exp(-2kt) \sin 2wt$ with envelope $\pm\exp(-2kt)$ is equivalent to $\exp(-kt) \sin wt$ with a change of time scale (old time/ new time=2/1). The law as determined by the ratio of successive (alternating in sign) peaks is the same; for example, $m1/m2=n1/n2$. (The fact that encoding is carried out more quickly than decoding is not a defect in an instantaneous compander for PCM transmission.)

The waveform generated by the damped waveform generator may be simply a damped exponential of the form $\exp(-bt)$.

This is equivalent to the envelope of an exponentially damped sinusoid. A damped exponential sampled at equal intervals gives the same sample amplitude values as would be obtained from a damped sinusoid with $k=b$ and only one (positive) threshold setting.

Compression for pulse code modulation information is not necessarily carried out at the same time as is the quantisation. Compression may be carried out by a method other than that described with reference to the encoder of FIGS. 1–3.

It is of course necessary to choose the decoder to fit the code (where there is a coder and the output is required to be an undistorted reconstruction of the original input to the coder, the decoder must be a match to the coder). This has been shown to be achieved, for example, by making the logarithmic decrement (measured as the ratio of successive peak samples) of the output of the damped waveform generator of the decoding arrangement match the compression law of the coder which may be for example of the kind described with reference to FIGS. 1–3. A regular compression law is a law which is known in such a way (e.g., as an explicit mathematical relationship) to enable a matching expansion law to be set up in the decoding arrangement.

While we have described above the principles of our invention in connection with specific apparatus it is to be clearly understood that this description is made only by way of example and not as a limitation to the scope of our invention as set forth in the objects thereof and in the accompanying claims.

We claim:

1. A decoder for a pulse code modulation word comprising:
a source of said word;
counter means coupled to said source responsive to said word to preset said counter means to a numerical value representing the value of said word;
generator means coupled to said source responsive to said word to produce simultaneously with the presetting of said counter means a damped wave train output having a fixed initial amplitude and a fixed rate of decay;
threshold detection means coupled to said generator means and said counter means producing an advance signal for said counter means when said wave train exceeds a given threshold value;
first means coupled to said counter means to produce a control signal when said counter means is full; and
second means coupled to said generator means and said first means to provide when said control signal is produced a pulse amplitude modulation output version of said word.

2. A decoder according to claim 1, wherein said damped wave train is an exponentially damped sine wave.

3. A decoder according to claim 1, wherein
said word is derived from an amplitude compressed pulse amplitude modulation input, and
said pulse amplitude modulation output of said second means is an amplitude expanded pulse amplitude modulation output to reconstruct said pulse amplitude modulation input before amplitude compression.

4. A decoder according to claim 1, wherein
said word includes a polarity indication, and
said second means is coupled to said source responsive to said polarity indication to determine the polarity of said pulse amplitude modulation output.

5. A decoder according to claim 1, wherein said threshold detection means includes positive and negative threshold values symmetrically disposed about the zero level of said damped wave train.

6. A decoder according to claim 1, wherein said counter means includes a binary counter having a counting range equal to the maximum pulse code modulation word normally encountered.

7. A decoder according to claim 1, wherein said first means includes a maximum count detector.

8. A decoder according to claim 1, wherein said second means includes gate means coupled to said generator means and said first means gated by said control signal to pass a given half cycle of said wave train after said control signal is produced, peak storage means coupled to said gate means to store the peak value of said given half cycle, and sampling gate means coupled to said peak storage means to provide said pulse amplitude modulation output.

9. A decoder according to claim 8, wherein said second means further includes a polarity inverter said word includes a polarity indication; and coupled to said source and said sampling gate means responsive to said polarity indication to determine the polarity of said pulse amplitude modulation output.

10. A decoder according to claim 1, wherein said counter means includes a binary counter;

said first means includes a maximum count detector; and said second means includes gate means coupled to said generator means and said maximum count detector gated by said control signal to pass a given half cycle of said wave train after said control signal is produced, peak storage means coupled to said gate means to store the peak value of said given half cycle, and sampling gate means coupled to said peak storage means to provide said pulse amplitude modulation output.

References Cited

UNITED STATES PATENTS

| | | | |
|---|---|---|---|
| 3,413,452 | 11/1968 | Schlein. | |
| 3,399,403 | 8/1968 | Reeves | 340—347 |
| 3,461,450 | 8/1969 | Rivaz | 340—347 |

MAYNARD R. WILBUR, Primary Examiner

J. GLASSMAN, Assistant Examiner

U.S. Cl. X.R.

179—15; 235—92; 325—38